(12) United States Patent
Chakraborty et al.

(10) Patent No.: US 11,774,478 B2
(45) Date of Patent: Oct. 3, 2023

(54) LOW POWER WIDEBAND MULTITONE GENERATOR

(71) Applicant: International Business Machines Corporation, Armonk, NY (US)

(72) Inventors: Sudipto Chakraborty, Plano, TX (US); George Russell Zettles, IV, Rochester, MN (US); Daniel Ramirez, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 17/407,694

(22) Filed: Aug. 20, 2021

(65) Prior Publication Data

US 2023/0054999 A1 Feb. 23, 2023

(51) Int. Cl.
| | | |
|---|---|---|
| H04B 1/26 | (2006.01) | |
| G01R 27/28 | (2006.01) | |
| H03K 5/01 | (2006.01) | |
| H03M 1/66 | (2006.01) | |
| H04B 1/10 | (2006.01) | |
| H04B 1/12 | (2006.01) | |
| H03K 5/00 | (2006.01) | |

(52) U.S. Cl.
CPC ............... *G01R 27/28* (2013.01); *H03K 5/01* (2013.01); *H03M 1/662* (2013.01); *H04B 1/10* (2013.01); *H04B 1/12* (2013.01); *H03K 2005/00013* (2013.01)

(58) Field of Classification Search
CPC .... G01R 27/28; H03M 1/662; H03M 1/0614; H03M 1/66; H03K 2005/00013; H03K 5/01; H04B 1/10; H04B 1/12; H04B 10/548
See application file for complete search history.

(56) References Cited

U.S. PATENT DOCUMENTS

| | | | |
|---|---|---|---|
| 7,982,646 B2 | 7/2011 | Herr et al. | |
| 8,502,720 B1 * | 8/2013 | Wyville | H03M 1/0629 341/149 |
| 8,786,476 B2 | 7/2014 | Bunyk et al. | |

(Continued)

FOREIGN PATENT DOCUMENTS

WO    2017139683 A1    8/2017

OTHER PUBLICATIONS

Ryan et al., "Hardware for Dynamic Quantum Computing" arXiv:1704.08314v1 [quant-ph] Apr. 26, 2017. 13 pages.

(Continued)

*Primary Examiner* — Nhan T Le
(74) *Attorney, Agent, or Firm* — Amin, Turocy & Watson, LLP

(57) ABSTRACT

Systems, devices, computer-implemented methods, and/or computer program products that facilitate low power, wideband multitone generation. In one example, a multitone generator device can comprise a controller operatively coupled to first and second digital-to-analog converters (DACs). The controller can apply different delays of a sampling signal to the first and second DACs to facilitate sideband suppression of signals output by the first and second DACs. One aspect of such a multitone generator device is that the multitone generator device can facilitate low power, wideband multitone generation.

20 Claims, 7 Drawing Sheets

(56) References Cited

U.S. PATENT DOCUMENTS

| | | | |
|---|---|---|---|
| 9,647,868 B2* | 5/2017 | Jiao | H04L 27/34 |
| 9,979,400 B1 | 5/2018 | Sete et al. | |
| 10,411,804 B2 | 9/2019 | Ashrafi et al. | |
| 10,643,143 B2 | 5/2020 | Bloom et al. | |
| 2005/0111573 A1 | 5/2005 | Shakeshaft et al. | |
| 2011/0075780 A1* | 3/2011 | Petrovic | H03M 1/0614 |
| | | | 375/355 |
| 2020/0266842 A1* | 8/2020 | Patel | H04B 1/04 |

OTHER PUBLICATIONS

International Search Report and Written Opinion for International Application No. PCT/EP2022/073155 dated Dec. 16, 2022.

* cited by examiner

LOW POWER WIDEBAND MULTITONE GENERATOR

BACKGROUND

The subject disclosure relates to signal generation, and more specifically, to systems, devices, computer-implemented methods, and/or computer program products that facilitate low power, wideband multitone generation.

Signal generators can be used in various applications to generate electrical signals or tones for exciting one or more devices under test (DUT). Such DUTs can include, but not be limited to, sensors (e.g., Internet of things (IOT) sensors and other sensors) and/or quantum computing devices (e.g., qubits and/or other quantum computing devices). Some signal generators can use digital-to-analog converters (DACs) to convert digital signals comprising baseband information into analog signals that can be subsequently upconverted to higher frequency (e.g., radio frequency (RF)) signals by mixers for exciting a DUT. While effective in some circumstances, the mixers that such signal generators use for upconversion consume energy which thereby increases the overall power consumed in generating electrical signals or tones for exciting a DUT. The mixers can also introduce additional frequency conversion products (e.g., spurs) into the generated signals. While higher order filters can mitigate the impact of those additional frequency conversion products, the power consumed by such filters can further increase the overall power consumed in generating electrical signals or tones for exciting a DUT.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate low power, wideband multitone generation are described.

According to an embodiment, a multitone generator device can comprise a controller operatively coupled to first and second digital-to-analog converters (DACs). The controller can apply different delays of a sampling signal to the first and second DACs to facilitate sideband suppression of signals output by the first and second DACs. One aspect of such a multitone generator device is that the multitone generator device can facilitate low power, wideband multitone generation.

In an embodiment, the multitone generator device can further comprise a gain and filtering element (GFE) operatively coupled to an output of the first DAC. One aspect of such a multitone generator device is that the multitone generator device can facilitate mitigating a mismatch (e.g., a gain mismatch and/or a phase mismatch) in operations of the first and second DACs.

According to another embodiment, a computer-implemented method can comprise operatively coupling, by a system operatively coupled to a processor, a controller to first and second digital-to-analog converters (DACs) of a multitone generator device. The computer-implemented method can further comprise using, by the system, the controller to apply different delays of a sampling signal to the first and second DACs to facilitate sideband suppression of signals output by the first and second DACs. One aspect of such a computer-implemented method is that the computer-implemented method can facilitate low power, wideband multitone generation.

In an embodiment, the computer-implemented method can further comprise operatively coupling, by the system, a combinational circuit to the first and second DACs. The computer-implemented method can further comprise using, by the system, the combinational circuit to combine the signals output by the first and second DACs. One aspect of such a computer-implemented method is that the computer-implemented method can facilitate suppressing an image sideband at an output node of the multitone generator device.

According to another embodiment, a computer program product can comprise a computer readable storage medium having program instructions embodied therewith. The program instructions are executable by a processor to cause the processor to perform operations. The operations include operatively coupling, by the processor, a controller to first and second digital-to-analog converters (DACs) of a multitone generator device. The operations can further include using, by the processor, the controller to apply different delays of a sampling signal to the first and second DACs to facilitate sideband suppression of signals output by the first and second DACs. One aspect of such a computer program product is that the computer program product can facilitate low power, wideband multitone generation.

In an embodiment, the operations can further include operatively coupling, by the processor, a combinational circuit to the first and second DACs. The operations can further include using, by the processor, the combinational circuit to combine the signals output by the first and second DACs. One aspect of such a computer program product is that the computer program product can facilitate suppressing an image sideband at an output node of the multitone generator device.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 1:
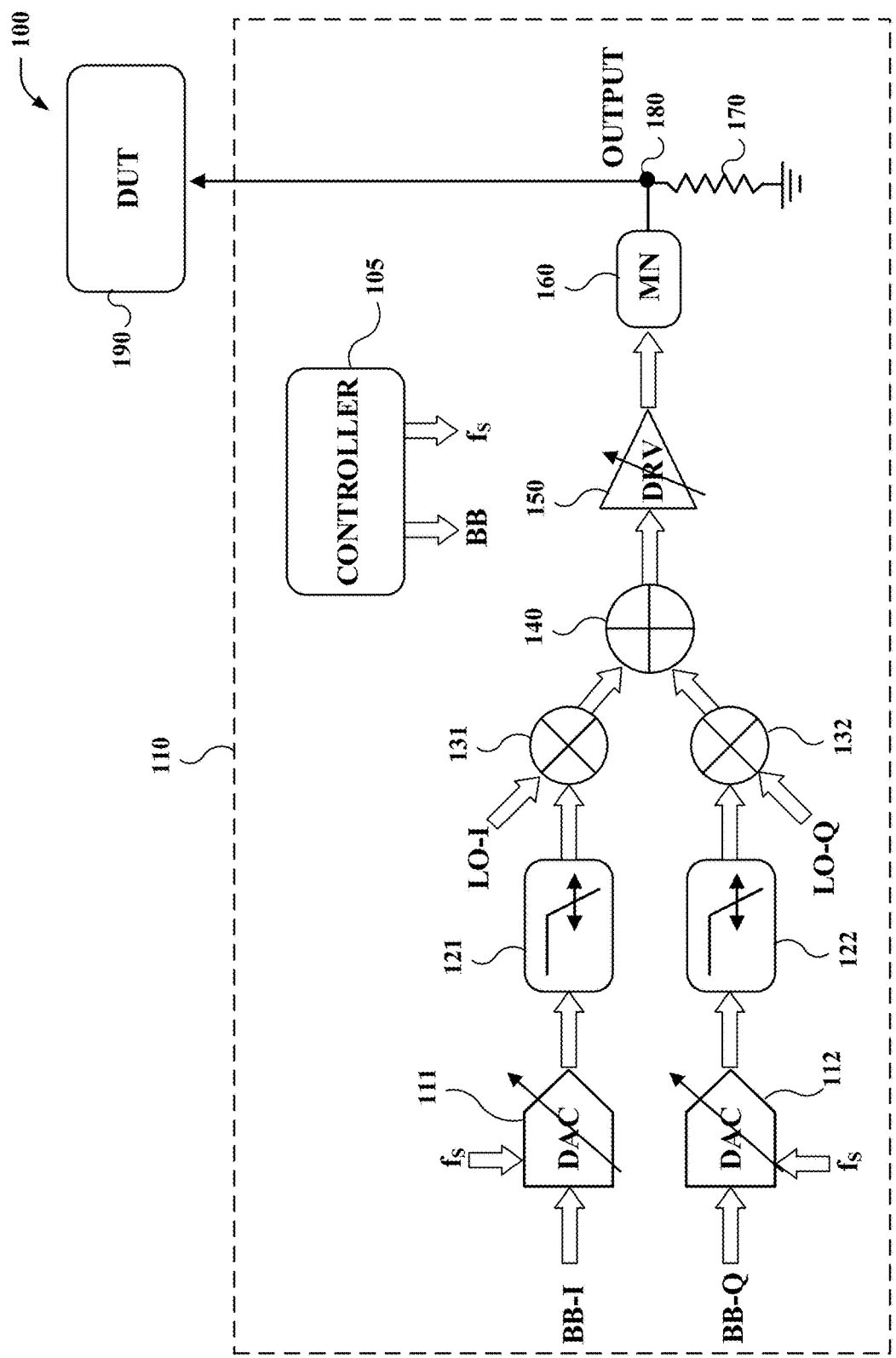
FIG. 1 illustrates a block diagram of an example, non-limiting architecture of a system that can facilitate tone generation.

FIG. 1 illustrates an example, non-limiting architecture of a system 100 that can facilitate tone generation. As shown by FIG. 1, system 100 can include a controller 105, a generator device 110, and a device under test (DUT) 190 operatively coupled to generator device 110 via output node 180. Generator device 110 can facilitate generating a single sideband signal at output node 180 comprising one or more characteristics. In an embodiment, the one or more characteristics can include: frequency; amplitude; and/or phase. The one or more characteristics of the single sideband signal generated by generator device 110 can excite one or more DUTs (e.g., DUT 190) operatively coupled to output node 180. Example devices suitable for implementing DUT 190 can include, but are not limited to: sensors (e.g., Internet of things (IOT) sensors and other sensors); quantum computing devices (e.g., qubits and/or other quantum computing devices); and/or other devices that can be excited by one or more characteristics of a single sideband signal generated by a generator device (e.g., generator device 110).

To facilitate generating a single sideband signal at output node 180, generator device 110 can include digital-to-analog converter (DAC) 111 and DAC 112. A controller 105 operatively coupled to DACs 111 and 112 can generate a digital signal and a sampling signal comprising a sampling frequency L. In FIG. 1, the digital signal is shown as a baseband signal BB. Controller 105 can apply an in-phase component BB-I of the baseband signal BB as input to DAC 111 and a quadrature component BB-Q of the baseband signal BB as input to DAC 112. Controller 105 can further apply the sampling signal to DAC 111 and DAC 112 to facilitate sampling operations by DAC 111 and DAC 112. A sampling operation by DAC 111 can comprise DAC 111 sampling the in-phase component BB-I of the baseband signal BB at the sampling frequency $f_s$ of the sampling signal. The sampling operation by DAC 111 can further comprise DAC 111 generating an analog signal (e.g., a continuous time signal) that is proportional to the in-phase component BB-I of the baseband signal BB. A sampling operation by DAC 112 can comprise DAC 112 sampling the quadrature component BB-Q of the baseband signal BB at the sampling frequency $f_s$ of the sampling signal. The sampling operation by DAC 112 can further comprise DAC 112 generating an analog signal (e.g., a continuous time signal) that is proportional to the quadrature component BB-Q of the baseband signal BB.

Figure 2:
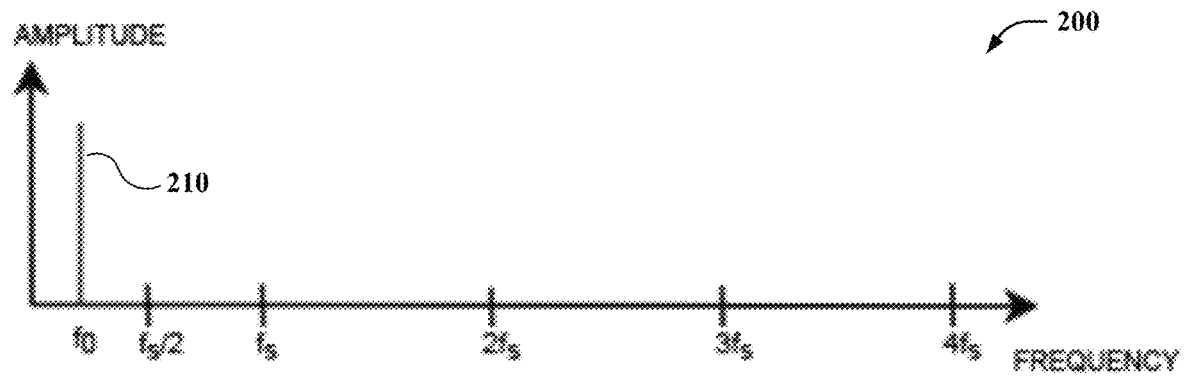
FIG. 2 illustrates an example, non-limiting graph depicting a sinusoidal signal in a frequency domain, in accordance with one or more embodiments described herein.

In addition to generating analog signals that are proportional to digital signals provided as input, such sampling operations by DACs 111 and 112 can introduce additional frequency conversion products, which can be referred to as harmonics, signal images, and/or spurs. By way of example, controller 105 can generate a digital signal representing an ideal, uniformly sampled sinusoidal signal (e.g., a sine wave signal and/or a cosine wave signal) comprising a frequency $f_0$. A DAC exhibiting ideal transient and/or static behavior (e.g., a DAC that does not exhibit harmonic distortion) can perform a sampling operation on that digital signal at a sampling frequency $f_s$. An output spectrum generated by the DAC exhibiting ideal transient and/or static behavior from that sampling operation can resemble the output spectrum shown by FIG. 2. In FIG. 2, graph 200 depicts the output spectrum in terms of amplitude (e.g., a Y-axis of graph 200) as a function of frequency (e.g., an X-axis of graph 200). As shown by FIG. 2, the output spectrum generated by the DAC exhibiting ideal transient and/or static behavior comprises a single spectral line 210 centered at the frequency $f_0$ of the ideal, uniformly sampled sinusoidal signal. The single spectral line 210 can be referred to as a fundamental tone.

Figure 3:
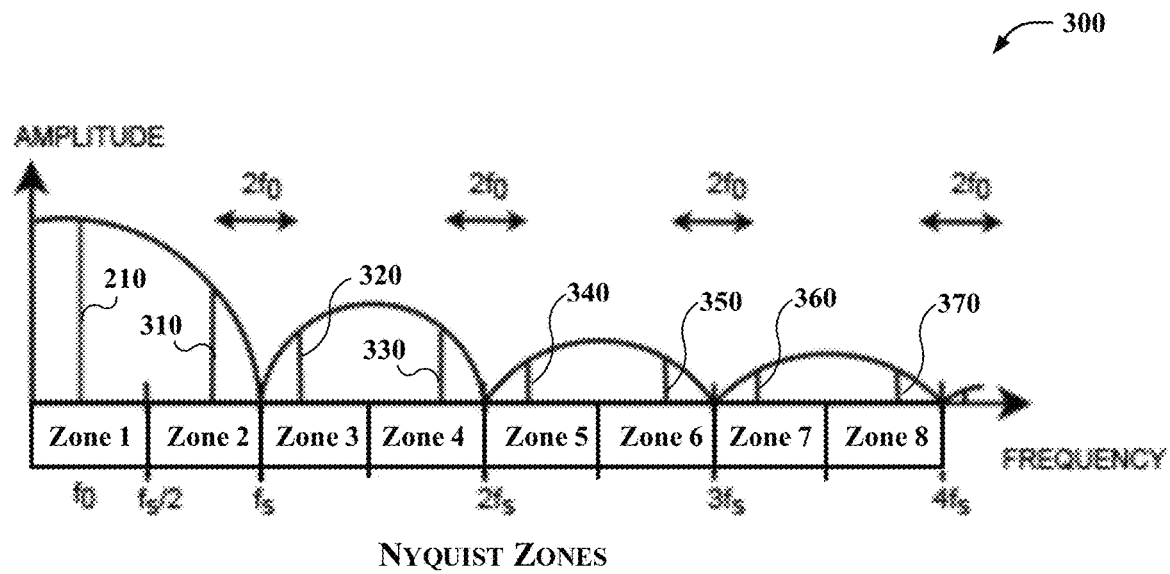
FIG. 3 illustrates an example, non-limiting graph depicting an output spectrum of a digital-to-analog converter (DAC) in a frequency domain, in accordance with one or more embodiments described herein.

DACs generally do not exhibit ideal transient and static behavior. Instead, DACs generally comprise nonlinear output characteristics and other characteristics that can introduce additional frequency conversion products into an output spectrum of a DAC. As such, an output spectrum generated by a DAC exhibiting non-ideal transient and/or static behavior performing a sampling operation on the digital signal representing the ideal, uniformly sampled sinusoidal signal can resemble the output spectrum shown by FIG. 3. In FIG. 3, graph 300 depicts the output spectrum in terms of amplitude (e.g., a Y-axis of graph 300) as a function of frequency (e.g., an X-axis of graph 300). As shown by FIG. 3, the output spectrum generated by the DAC exhibiting non-ideal transient and/or static behavior comprises the spectral line 210 centered at the frequency $f_0$ of the ideal, uniformly sampled sinusoidal signal and additional spectral components (or frequency conversion products) at frequencies higher than frequency $f_0$. In an embodiment, the additional spectral components can be defined using $|K \times f_s \pm f_o|$ where K can denote the Nyquist zone. In an embodiment, K can be an integer number.

FIG. 3 further shows that the output spectrum generated by the DAC exhibiting non-ideal transient and/or static behavior can be partitioned into consecutive bands that comprise a width defined by a Nyquist frequency ($f_s/2$) of the sampling operation. Such consecutive bands can be referred to as Nyquist zones with the first Nyquist zone (Zone 1) spanning from 0 hertz (Hz) to $f_s/2$, the second Nyquist zone (Zone 2) spanning from $f_s/2$ to $f_s$, and so on. In an embodiment, a Nyquist zone can be defined using $[(m-1) \times f_s/2, m \times f_s/2]$, where m can denote a Nyquist zone order. In FIG. 3, a spectrum of the digital signal representing the ideal, uniformly sampled sinusoidal signal exists within a single Nyquist zone (e.g., Zone 1). The sampling operation performed on the digital signal can generate a copy of the digital signal's spectrum in each odd Nyquist zone (e.g., Zones 3, 5, and/or 7) and an inverted copy of the digital signal's spectrum in each even Nyquist zone (e.g., Zones 2, 4, 6, and/or 8).

Such copies can be referred to as harmonics, harmonic tones, image sidebands, or sideband signals. Harmonics 320, 340, and/or 360 in graph 300 can be copies of spectral line 210 that the DAC exhibiting non-ideal transient and/or static behavior can generate by performing the sampling operation on the digital signal. Harmonics 310, 330, 350, and/or 370 in graph 300 can be inverted copies of spectral line 210 that DAC can generate by performing the sampling operation.

Since the digital signal being sampled comprises a single frequency (e.g., frequency $f_0$), the copies (e.g., harmonics 320, 340, and/or 360) of spectral line 210 and the inverted copies (e.g., harmonics 310, 330, 350, and/or 370) copies of spectral line 210 can comprise the same information as spectral line 210.

The DAC generating the output spectrum depicted in graph 300 can perform the sampling operation using a zero-order hold (or non-return-to-zero) operating mode. The zero-order hold operating mode can involve the DAC holding an output value constant between samples (e.g., for a duration of a sampling period). The zero-order hold operating mode can comprise an attenuation profile or frequency response that can be defined by a sinc function (e.g., sin(x)/x). One aspect of that attenuation profile of the zero-order hold operating mode can involve the output spectrum generated by the DAC decreasing in amplitude as frequency increases. For example, in graph 300, spectral line 210 comprises a greater amplitude than harmonic 310, which comprises a greater amplitude than harmonic 320.

With reference to FIG. 1, generator device 110 can further include low pass filters 121 and 122 coupled to the outputs of DACs 111 and 112, respectively. Low pass filters 121 and 122 can facilitate mitigating additional frequency conversion products (e.g., harmonics, signal images, and/or spurs) that sampling operations by DACs 111 and 112, respectively, introduce into their corresponding output signals. For example, low pass filters 121 and/or 122 can receive the output spectrum of FIG. 3 as input. In this example, low pass filters 121 and/or 122 can process the output spectrum of FIG. 3 such that an amplitude of spectral line 210 can be substantially preserved while respective amplitudes of harmonics 310, 320, 330, 340, 350, 360, and/or 370 can be reduced. An output of low pass filter 121 can be provided as input to mixer 131 and an output of low pass filter 122 can be provided as input to mixer 132.

As shown by FIG. 1, a mixer (e.g., mixers 131 and/or 132) can receive two signals as input: an intermediate frequency (IF) signal; and a local oscillator (LO) signal. The IF signal can generally be a low frequency signal that can contain information about a message to be transmitted. Continuing with the example above in which low pass filters 121 and/or 122 process the output spectrum of FIG. 3, the IF signal can comprise spectral line 210. The LO signal can be a clock signal generated by a local oscillator (e.g., a local oscillator associated with controller 105) that can facilitate a switching operation of the mixer. The switching operation of the mixer can involve shifting baseband information of the IF signal from an IF frequency to a radio frequency (RF) to form an RF signal. In addition to forming the RF signal, the switching operation of the mixer can introduce additional frequency conversion products into the RF signal. In an embodiment, the RF frequency can be defined by $\omega_{RF}=\omega_{LO}\pm\omega_{IF}$, where $\omega_{RF}$ can denote an angular frequency of the RF signal, $\omega_{LO}$ can denote an angular frequency of the LO signal, and $\omega_{IF}$ can denote an angular frequency of the IF signal.

The mixer can process real signals or complex signals. When the mixer processes real signals, the switching operation of the mixer can generally involve multiplying two real signals. When the mixer processes complex signals, both the IF signal and the LO signal can be represented as orthogonal vectors using quadrature phases. In such instances involving complex signals, the switching operation can generally involve multiplying two orthogonal vectors representing the IF and LO signals to obtain a complex product at an upper sideband or a lower sideband. In an embodiment, the upper sideband can be defined by $\omega_{RF}=\omega_{LO}+\omega_{IF}$. In an embodiment, the lower sideband can be defined by $\omega_{RF}=\omega_{LO}-\omega_{IF}$. A complex IF signal can be represented as orthogonal vectors using in-phase and quadrature signals. In an embodiment, an in-phase component of a time varying IF signal WO can be defined as $I_{IF}(t)=p_I(t)\cos(\omega_{IF}t)+p_Q(t)\sin(\omega_{IF}t)$, where $p_I$ can denote the amplitude of the I phase signal, $p_Q$ can denote the amplitude of the Q phase signal, and t can denote time. In an embodiment, a quadrature component of a time varying IF signal ($Q_{IF}(t)$) can be defined as $Q_{IF}(t)=p_Q(t)\cos(\omega_{IF}t)-p_I(t)\sin(\omega_{IF}t)$.

A time varying RF signal RF(t) obtained from a switching operation of a mixer that processes a complex IF signal can be defined as $RF(t)=I_{IF}*\cos(\omega_{LO}t)\pm Q_{IF}*\sin(\omega_{LO}t)$. That definition for the time varying RF signal RF(t) can provide two solutions corresponding to a lower sideband $RF_1(t)$ and an upper sideband $RF_2(t)$. In an embodiment, the lower sideband $RF_1(t)$ can be defined as $RF_1(t)=p_I(t)*\cos\{(\omega_{LO}-\omega_{RF})t\}-p_Q(t)\sin\{(\omega_{LO}-\omega_{RF})t\}$. In an embodiment, the upper sideband $RF_2(t)$ can be defined as $RF_2(t)=p_I(t)*\cos\{(\omega_{LO}+\omega_{IF})t\}-p_Q(t)\sin\{(\omega_{LO}+\omega_{IF})t\}$.

Generator device 110 can further include a combinational circuit 140 (e.g., a summer circuit) coupled to the respective outputs of mixers 131 and 132. Combinational circuit 140 can generally combine time-varying RF signals received from mixers 131 and 132 to suppress an image sideband at output node 180 to provide a single sideband signal at output node 180. In FIG. 1, combinational circuit 140 is depicted as a summer circuit that can combine time-varying RF signals received from mixers 131 and 132 to suppress a lower sideband signal at output node 180 to provide an upper sideband signal at output node 180. In one or more embodiments, combinational circuit 140 can be a subtractor circuit that can combine time-varying RF signals received from mixers 131 and 132 to suppress an upper sideband signal at output node 180 to provide a lower sideband signal at output node 180. Combinational circuit 140 can output the single sideband signal to driver 150 for further processing (e.g., amplifying the single sideband signal and/or filtering additional frequency conversion products introduced by a switching operation of a mixer).

Matching network (MN) 160 can facilitate optimizing an impedance between driver 150 and an output load that can be represented in FIG. 1 by resistance 170 and DUT 190. For example, MN network 160 can facilitate mitigating an impedance mismatch between driver 150 and the output load. As another example, MN network 160 can facilitate improving an impedance match between driver 150 and the output load. Optimizing an impedance between driver 150 and the output load can facilitate maximizing power transfer from driver 150 to the output load at output node 180.

System 100 can be generally flexible to the extent that system 100 can work with a number of modulation schemes and/or can accommodate variations corresponding to a sampling signal $f_s$ and/or an LO signal. However, system 100 is generally incapable of performing signal generation at two or more frequencies simultaneously without modification. Examples of such modifications can include, but not be limited to, increasing power of the LO signal, adding hardware (e.g., additional DACs, additional mixers, combinational circuits, and/or additional drivers) to generator device 110, and/or other modifications. While system 100 can be modified in some instances to perform signal generation at two or more frequencies simultaneously, such modifications can involve increasing power consumption by system 100 and/or increasing device footprint of generator device 110.

Figure 4:
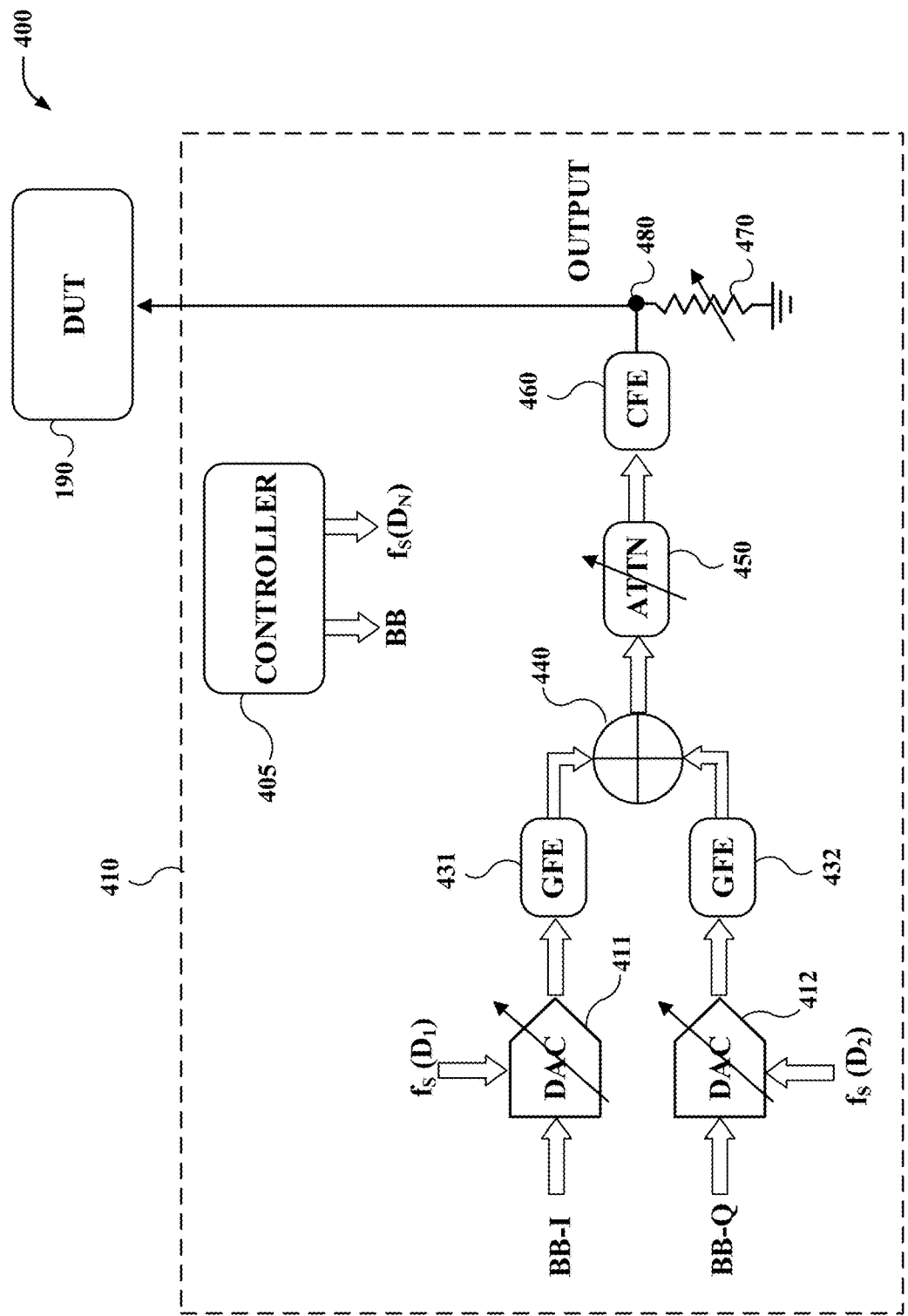
FIG. 4 illustrates a block diagram of an example, non-limiting architecture of a system that can facilitate multitone generation, in accordance with one or more embodiments described herein.

FIG. 4 illustrates a block diagram of an example, non-limiting architecture of a system 400 that can facilitate multitone generation, in accordance with one or more embodiments described herein. As shown by FIG. 4, system 400 can include a controller 405, a multitone generator device 410, and a device under test (DUT) 190 operatively coupled to multitone generator device 410 via output node 480. Multitone generator device 410 can facilitate performing signal generation at two or more frequencies simultaneously. That is, multitone generator device 410 can facilitate generating a multitone signal comprising a plurality of tones centered at different frequencies. A multitone signal generated by multitone generator device 410 can be available at output node 480 for exciting one or more DUTs (e.g., DUT 190) operatively coupled to output node 480.

Figure 5:
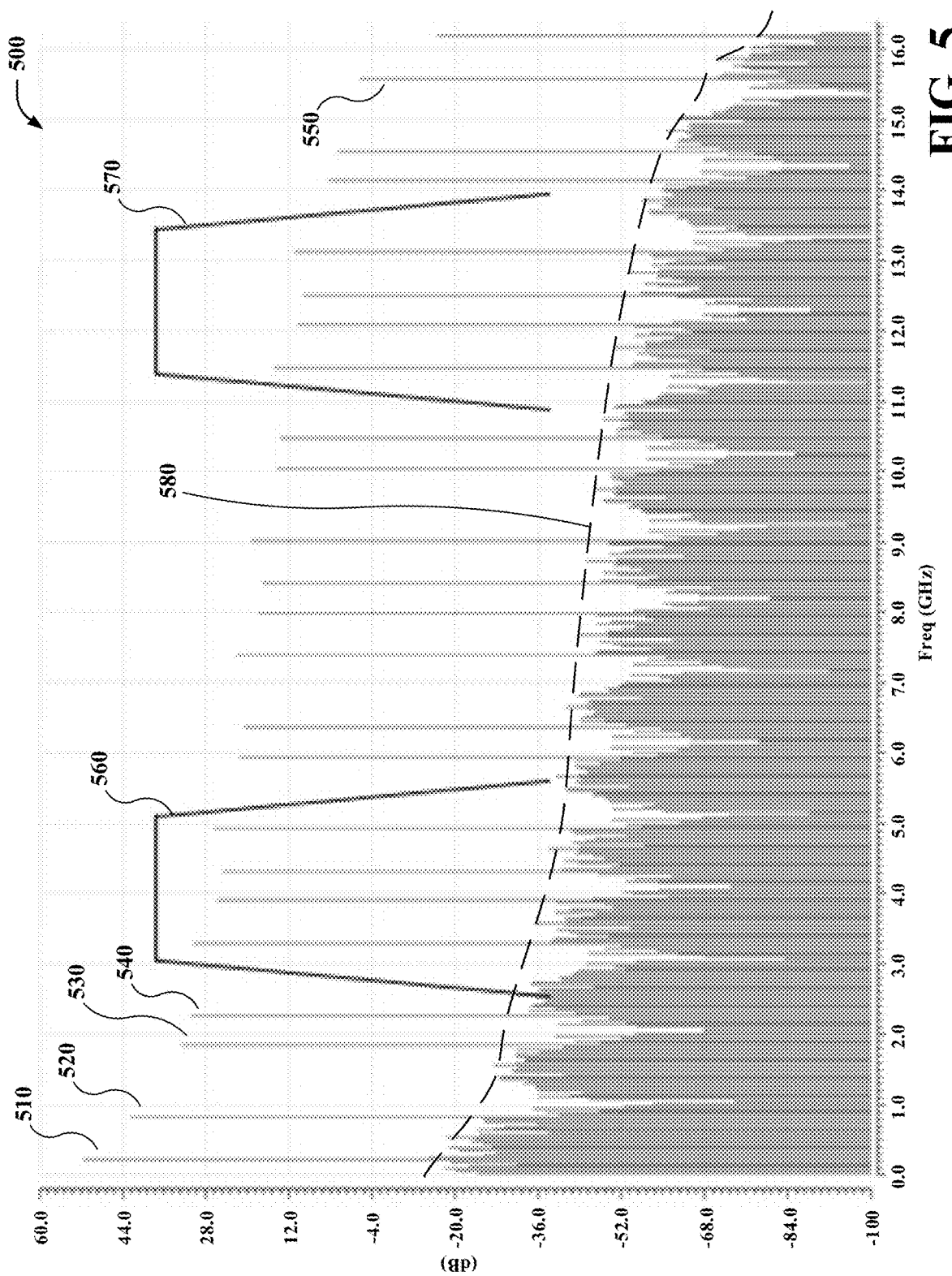
FIG. 5 illustrates an example, non-limiting graph depicting an output spectrum of a radio frequency (RF) DAC in a frequency domain, in accordance with one or more embodiments described herein.

To facilitate generating a multitone signal, multitone generator device 410 can include DAC 411 and DAC 412. DACs 411 and/or 412 can be implemented using a RF DAC that can directly synthesize a time-varying RF signal from a baseband signal provided as an input. By way of example, FIG. 5 illustrates an example, non-limiting graph 500 depicting an output spectrum of a RF DAC (e.g., DACs 411 and/or 412) in a frequency domain, in accordance with one or more embodiments described herein. In FIG. 5, graph 500 depicts the output spectrum in terms of amplitude (e.g., a Y-axis of graph 500) as a function of frequency (e.g., an X-axis of graph 500). As shown by FIG. 5, the output spectrum generated by the RF DAC can comprise a fundamental tone 510 centered at a frequency $f_{bb}$ (e.g., 208 megahertz (MHz)) of a baseband signal and a number of harmonic tones that the RF DAC can generate by performing a sampling operation on the baseband signal at a sampling frequency $f_s$ (e.g., 1024 MHz). In FIG. 5, such harmonic tones can include harmonic tone 520 centered at a frequency of approximately 816 MHz (e.g., $f_s-f_{bb}$), harmonic tone 530 centered at a frequency of approximately 1.84 gigahertz (GHz) (e.g., $2f_s-f_{bb}$), and/or harmonic tone 540 centered at a frequency of approximately 2.256 GHz (e.g., $2f_s+f_{bb}$). As further shown by FIG. 5, such harmonic tones can also include harmonic tones centered at frequencies that exceed 15 GHz (e.g., harmonic tone 550).

The RF DAC generating the output spectrum depicted in graph 500 can perform the sampling operation using a zero-order hold (or non-return-to-zero) operating mode. The zero-order hold operating mode can involve the RF DAC holding an output value constant between samples (e.g., for a duration of a sampling period). The zero-order hold operating mode can comprise an attenuation profile or frequency response that can be defined by a sinc function (e.g., sin(x)/x). One aspect of that attenuation profile of the zero-order hold operating mode can involve the output spectrum generated by the RF DAC decreasing in amplitude as frequency increases. For example, in graph 500, fundamental tone 510 can comprise a greater amplitude than harmonic tone 520, which can comprise a greater amplitude than harmonic tone 530.

With reference to FIG. 4, one aspect of implementing DACs 411 and/or 412 using a RF DAC can involve a frequency response of multitone generator device 410 being wider than a frequency response of generator device 110. This aspect can facilitate creating a multitone generator device 410 with a wide frequency response to support wide bandwidth operation. Another aspect of implementing DACs 411 and/or 412 using a RF DAC can involve obtaining higher frequency tones (e.g., harmonic tone 550 of FIG. 5) at output node 480 without further upconversion by a mixer. This aspect can facilitate reducing power consumption by system 400 relative to system 100. This aspect can also facilitate decreasing a device footprint of multitone generator device 410 relative to a device footprint of generator device 110. Stated differently, the foregoing aspects of implementing DACs 411 and/or 412 using a RF DAC can facilitate providing multitone generator device 410 with wideband coverage and/or higher integration.

In system 400, controller 405 can apply an in-phase component BB-I of the baseband signal BB as input to DAC 411 and a quadrature component BB-Q of the baseband signal BB as input to DAC 412. Controller 405 can further apply different delays of a sampling signal comprising a sampling frequency $f_s$ to DAC 411 and DAC 412 to facilitate sampling operations by DAC 411 and DAC 412. For example, a sampling operation by DAC 411 can comprise DAC 411 sampling the in-phase component BB-I of the baseband signal BB at the sampling frequency $f_s$ of the sampling signal with a first delay $D_1$. As another example, a sampling operation by DAC 412 can comprise DAC 412 sampling the quadrature component BB-Q of the baseband signal BB at the sampling frequency $f_s$ of the sampling signal with a second delay $D_2$ that is different from the first delay $D_1$. As discussed in greater detail below, controller 405 can apply the different delays of the sampling signal to DACs 411 and 412 to facilitate sideband suppression of signals output by DACs 411 and 412. In an embodiment, the different delays of the sampling signal can include different phases of the sampling signal, different duty cycles of the sampling signal, and/or a combination thereof.

From such sampling operations, DAC 411 and DAC 412 can each generate time-varying RF signals comprising output spectrums that can be similar to the output spectrum shown by FIG. 5. Multitone generator device 410 can independently control an amplitude corresponding to a particular RF signal generated by a given DAC in a digital domain and/or in an analog domain. Independently controlling an amplitude corresponding to a particular RF signal generated by a given DAC can facilitate mitigating a gain mismatch and/or a phase mismatch between DAC 411 and DAC 412.

In the digital domain, controller 405 can adjust an amplitude corresponding to the particular RF signal generated by the given DAC by adjusting an amplitude corresponding to the baseband signal BB input to that DAC. For example, controller 405 can adjust an amplitude corresponding to the in-phase component BB-I of the baseband signal BB input to DAC 411 to facilitate adjusting an amplitude corresponding to an RF signal generated by DAC 411 in the digital domain. As another example, controller 405 can adjust an amplitude corresponding to the quadrature component BB-Q of the baseband signal BB input to DAC 412 to facilitate adjusting an amplitude corresponding to an RF signal generated by DAC 412 in the digital domain.

In the analog domain, a gain and filtering element (GFE) coupled to an output of the given DAC can adjust an amplitude corresponding to the particular RF signal generated by the given DAC. In an embodiment, the GFE can adjust the amplitude corresponding to the particular RF signal using a variable amplifier that can facilitate increasing an amplitude associated with, at least, a subset of an output spectrum of the particular RF signal. For example, GFE 431 coupled to an output of DAC 411 can adjust an amplitude associated with, at least, a subset of an output spectrum of an RF signal generated by DAC 411 in the analog domain using a variable amplifier. In an embodiment, the GFE can adjust the amplitude corresponding to the particular RF signal using a filtering element (e.g., a band pass filter, a low pass filter, a high pass filter, and/or other filtering elements)

that can facilitate decreasing an amplitude associated with, at least, a subset of an output spectrum of the particular RF signal. For example, GFE 432 coupled to an output of DAC 412 can adjust an amplitude associated with, at least, a subset of an output spectrum of an RF signal generated by DAC 412 in the analog domain using a filtering element.

As discussed above, controller 405 can apply different delays of the sampling signal to DACs 411 and 412 to facilitate sideband suppression of signals output by DACs 411 and 412. To that end, one or more individual tones comprising a particular time-varying RF signal can be delayed (e.g., phase shifted) with respect to other tones of that RF signal by digitally configuring delays introduced into the sampling signal by controller 405. For example, controller 405 can digitally configure such delays by programming a divider circuit. In an embodiment, the different delays of the sampling signal can include different phases of the sampling signal, different duty cycles of the sampling signal, or a combination thereof. In an embodiment, controller 405 can apply the different delays of the sampling signal to DACs 411 and 412 using a phase shift of $\pi/N$ to facilitate canceling sidebands of the signals output by DACs 411 and 412 at frequencies of $(2m-1)*N$, where m denotes Nyquist zone order and N denotes an order of harmonic. In an embodiment, a Nyquist zone order m and/or an order of harmonic N can be defined using a filter profile (e.g., a lowpass filter profile and/or a bandpass filter profile) of GFEs 431 and/or 432. In an embodiment, controller 405 can facilitate single sideband signal generation using the DAC systems along. In this embodiment, controller 405 can provide an orthogonal signal to DACs 411 and/or 412 in terms of a digital word (e.g., the baseband signal BB input) and sampling clocks (e.g., the sampling signal comprising the sampling frequency $f_s$) that can be orthogonal to each other. In an embodiment, controller 405 can provide DAC 412 with a baseband signal BB input and a sampling signal that can delayed by 120 degrees and 90 degrees, respectively, with respect to the corresponding baseband signal BB input and the sampling signal provided to DAC 411.

Multitone generator device 410 can further include a combinational circuit 440 (e.g., a summer circuit) coupled to the respective outputs of GFEs 431 and 432. Combinational circuit 440 can generally combine time-varying RF signals received from GFEs 431 and 432 to suppress an image sideband at output node 480. In FIG. 4, combinational circuit 440 is depicted as a summer circuit that can combine time-varying RF signals received from GFEs 431 and 432 to suppress a lower sideband signal at output node 480 to provide an upper sideband signal at output node 480. In one or more embodiments, combinational circuit 440 can be a subtractor circuit that can combine time-varying RF signals received from GFEs 431 and 432 to suppress an upper sideband signal at output node 480 to provide a lower sideband signal at output node 480.

By combining the time-varying RF signals received from GFEs 431 and 432, combinational circuit 440 can output a multitone signal to which each DAC (e.g., DACs 411 and/or 412) can contribute a plurality of tones within a dynamic range of that DAC. For example, DAC 411 and DAC 412 can each generate a time-varying RF signal with an output spectrum that can be similar to the output spectrum shown by FIG. 5. In this example, combinational circuit 440 can combine one or more of a fundamental tone and a plurality of harmonic tones of the time-varying RF signal generated by DAC 411 with one or more of a fundamental tone and a plurality of harmonic tones of the time-varying RF signal generated by DAC 412 to output a multitone signal. In an embodiment, and with reference to FIG. 5, a dynamic range of a given DAC can be defined using ratio between a power of fundamental tone 510 and a power of a noise floor 580. In an embodiment, and with reference to FIG. 5, a dynamic range of a given DAC can be defined using a ratio between a power of fundamental tone 510 and a power of a harmonic tone (e.g., harmonic tone 520) having a highest power among a plurality of harmonic tones comprising the output spectrum.

Attenuator circuit 450 can facilitate calibrating an amplitude of a multitone signal provided at output node 480 by adjusting, at least, a subset of an output spectrum of the multitone signal output by combinational circuit 440. In an embodiment, attenuator circuit 450 can facilitate calibrating the amplitude of the multitone signal provided at output node 480 using a filtering element (e.g., a band pass filter, a low pass filter, a high pass filter, and/or other filtering elements) that can facilitate decreasing an amplitude associated with, at least, a subset of the output spectrum of the multitone signal output by combinational circuit 440. In an embodiment, attenuator circuit 450 can facilitate calibrating the amplitude of the multitone signal provided at output node 480 using a variable amplifier that can facilitate increasing an amplitude associated with, at least, a subset of the output spectrum of the multitone signal output by combinational circuit 440.

Multitone generator device 410 can further include a channel filtering element (CFE) 460 coupled to an output of attenuator circuit 450. CFE 460 can generally facilitate selecting a subset of tones comprising the multitone signal output by attenuator circuit 450. To that end, CFE, 460 can comprise a filtering element (e.g., a band pass filter, a low pass filter, a high pass filter, and/or other filtering elements) with an adjustable passband corresponding to a defined range of frequencies. The adjustable passband can be set such that the filtering element of CFE 460 passes a subset of tones comprising the multitone signal that are associated with the defined range of frequencies while rejecting tones of the multitone signal that are associated with frequencies outside of that defined range of frequencies.

For example, the multitone signal output by attenuator circuit 450 can comprise the output spectrum shown by FIG. 5. In one instance, the subset of tones selected by CFE 460 can comprise harmonic tone 540. In this instance, a defined range of frequencies corresponding to the adjustable passband of the filtering element comprising CFE, 460 can be set such that a frequency of harmonic tone 540 is within the defined range of frequencies while frequencies of other tones (e.g., a frequency of harmonic tone 530) are outside of the defined range of frequencies. In other instances, the subset of tones selected by CFE 460 can comprise a cluster of tones. For example, the subset of tones selected by CFE 460 can comprise tone cluster 560. In this example, a defined range of frequencies corresponding to the adjustable passband of the filtering element comprising CFE 460 can be set such that frequencies of tones comprising tone cluster 560 are within the defined range of frequencies while frequencies of other tones (e.g., a frequency of harmonic tone 540 and/or frequencies of tones comprising tone cluster 570) are outside of the defined range of frequencies.

Multitone generator device 410 can also include an adjustable impedance element 470 coupled to output node 480. Adjustable impedance element 470 can facilitate optimizing an impedance match between multitone generator device 410 and one or more DUTs (e.g., DUT 190) operatively coupled to output node 480. For example, adjustable impedance element 470 can facilitate mitigating an impedance mismatch between multitone generator device 410 and the one or more DUTs. As another example, adjustable impedance element 470 can facilitate improving an impedance match between multitone generator device 410 and the one or more DUTs. Optimizing an impedance between multitone generator device 410 and the one or more DUTs can facilitate maximizing power transfer from multitone generator device 410 to the one or more DUTs via output node 480.

Figure 6:
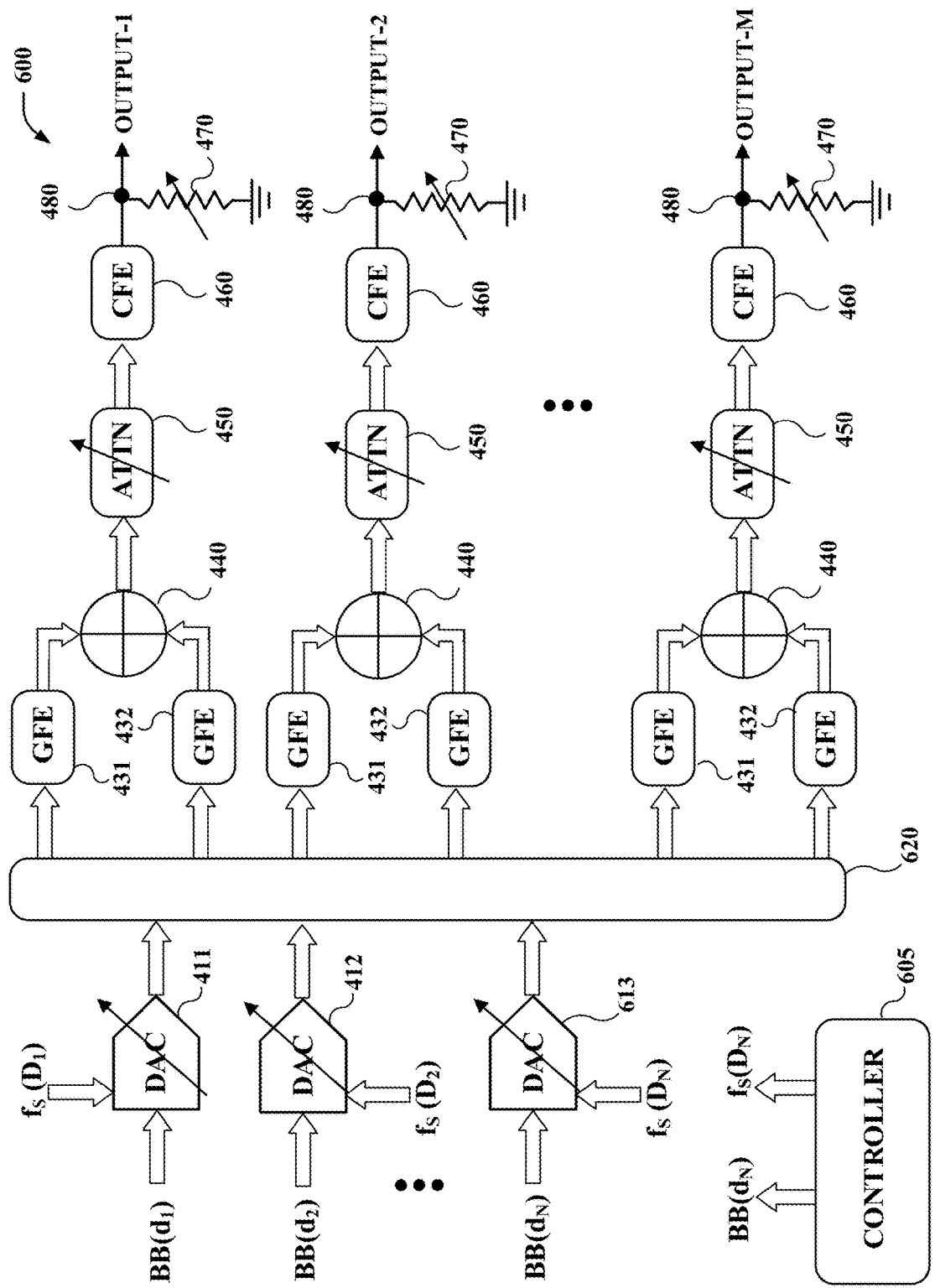
FIG. 6 illustrates a block diagram of an example, non-limiting multitone generator device, in accordance with one or more embodiments described herein.

FIG. 6 illustrates a block diagram of an example, non-limiting multitone generator device 600, in accordance with one or more embodiments described herein. As shown by FIG. 6, multitone generator device 600 can comprise a multiplexer 620 that can facilitate scalability. To that end, multiplexer 620 can facilitate scalability with respect to a number of DACs comprising multitone generator device 600 and/or a number of output channels that can facilitate propagating different multitone signals to one or more DUTs operatively coupled to multitone generator device 600. By way of example, FIG. 6 shows that multitone generator device 600 an comprise N-DACs (e.g., DACs 411, 412, and/or 613) operatively coupled to M-output channels (e.g., OUTPUT-1, OUTPUT-2, and/or OUTPUT-M) via multiplexer 620.

To facilitate generation of multitone signals, controller 605 can apply different delays of a baseband signal BB as input to the N-DACs comprising multitone generator device 600. For example, controller 605 can apply the baseband signal BB with: (i) a first delay $d_1$ (e.g., a 0-degree phase shift) as input to DAC 411; (ii) a second delay $d_2$ (e.g., a 90-degree phase shift) as input to DAC 412; and/or (iii) a third delay $d_3$ (e.g., a 45-degree phase shift) as input to DAC 613. To further facilitate generation of multitone signals, controller 605 can also apply different delays of a sampling signal comprising a sampling frequency $f_s$ to the N-DACs comprising multitone generator device 600. For example, controller 605 can apply the sampling signal comprising the sampling frequency $f_s$ with: (i) a first delay $D_1$ (e.g., a 90-degree phase shift) to DAC 411; (ii) a second delay $D_2$ (e.g., a 60-degree phase shift) as to DAC 412; and/or (iii) a third delay $D_3$ (e.g., a 120-degree phase shift) to DAC 613. As discussed above, controller 605 can apply different delays of the sampling signal to the N-DACs comprising multitone generator device 600 to facilitate sideband suppression of signals output by the N-DACs. In an embodiment, controller 605 can offset the different delays of the sampling signal and/or the different delays of the baseband signal BB by a delay offset defined using a number of DACs comprising the N-DACs. In an embodiment, the delay offset can be defined as $\pi/N$, where N=the number of DACs comprising the N-DACs.

Multiplexer 620 can couple the N-DACs comprising multitone generator device 600 with the M-output channels via different configurations to facilitate flexibility with respect to the set of tones comprising a given multitone signal that is available for selection by a particular CFE 460 (e.g., CFE 460 of output channel OUTPUT-1). For example, in a first configuration, multiplexer 620 can couple: (i) outputs of DACs 412 and 613 to inputs of GFEs 431 and 432 comprising output channel OUTPUT-1, respectively; (ii) outputs of DACs 411 and 412 to inputs of GFEs 431 and 432 comprising output channel OUTPUT-2, respectively; and/or (iii) outputs of DACs 411 and 613 to inputs of GFEs 431 and 432 comprising output channel OUTPUT-M, respectively. As another example, in a second configuration, multiplexer 620 can couple: (i) outputs of DACs 411 and 613 to inputs of GFEs 431 and 432 comprising output channel OUTPUT-1, respectively; (ii) outputs of DACs 613 and 411 to inputs of GFEs 431 and 432 comprising output channel OUTPUT-2, respectively; and/or (iii) outputs of DACs 613 and 412 to inputs of GFEs 431 and 432 comprising output channel OUTPUT-M, respectively.

Figure 7:
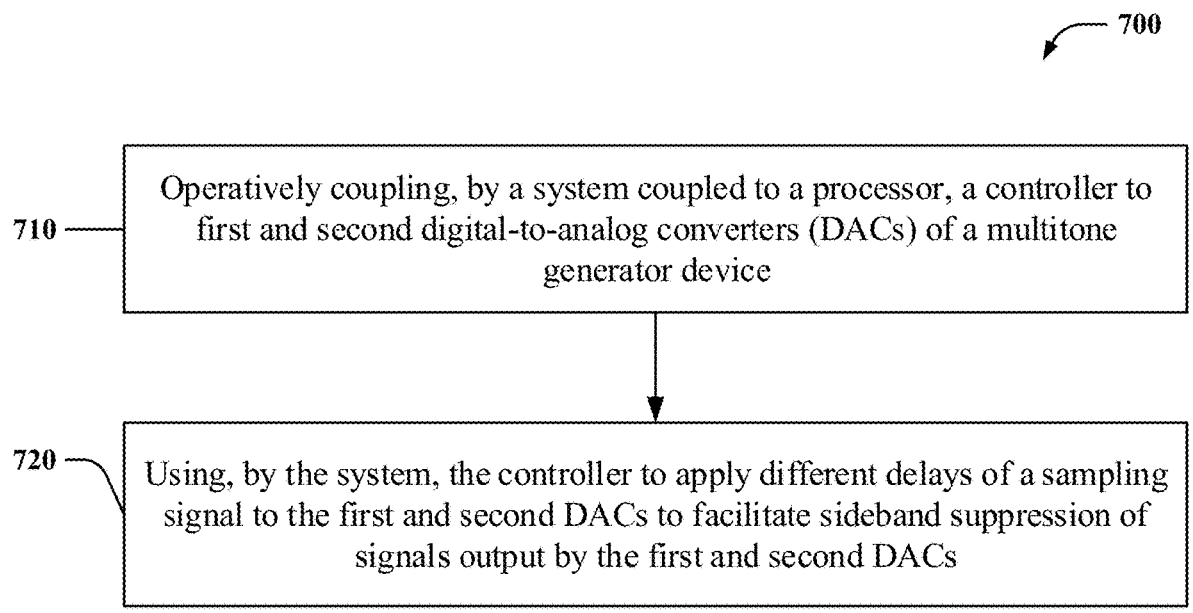
FIG. 7 illustrates a flow diagram of an example, non-limiting computer-implemented method of facilitating low power, wideband multitone generation, in accordance with one or more embodiments described herein.

FIG. 7 illustrates a flow diagram of an example, non-limiting computer-implemented method 700 of facilitating low power, wideband multitone generation, in accordance with one or more embodiments described herein. Repetitive description of like elements employed in other embodiments described herein is omitted for sake of brevity. At 710, the computer-implemented method 700 can comprise operatively coupling, by a system operatively coupled to a processor, a controller to first and second DACs of a multitone generator device. At 720, the computer-implemented method 700 can comprise using, by the system, the controller to apply different delays of a sampling signal to the first and second DACs to facilitate sideband suppression of signals output by the first and second DACs. In an embodiment, using the controller to apply different delays of the sampling signal to the first and second DACs can comprise using, by the system, a phase shift of n/N to facilitate canceling sidebands of the signals at frequencies of $(2m-1)*N$. The m can denote Nyquist zone order and the N can denote an order of harmonic.

In an embodiment, the computer-implemented method 700 can further comprise: operatively coupling, by the system, a combinational circuit to the first and second DACs. In an embodiment, method 700 can further comprise using, by the system, the combinational circuit to combine the signals output by the first and second DACs to suppress an image sideband at an output node of the multitone generator. In an embodiment, the combinational circuit can be a summer circuit. In an embodiment, using the combinational circuit to combine the signals can comprise using, by the system, the summer circuit to combine the signals output by the first and second DACs to suppress a lower image sideband at the output node of the multitone generator device. In an embodiment, the combinational circuit can be a subtractor circuit. In an embodiment, using the combinational circuit to combine the signals can comprise using, by the system, the subtractor to combine the signals output by the first and second DACs to suppress an upper image sideband at the output node of the multitone generator.

In an embodiment, the computer-implemented method 700 can further comprise operatively coupling, by the system, an attenuator circuit to the first and second DACs. In an embodiment, the computer-implemented method 700 can further comprise using, by the system, the attenuator circuit to calibrate an amplitude at an output node of the multitone generator device in an analog domain.

Figure 8:
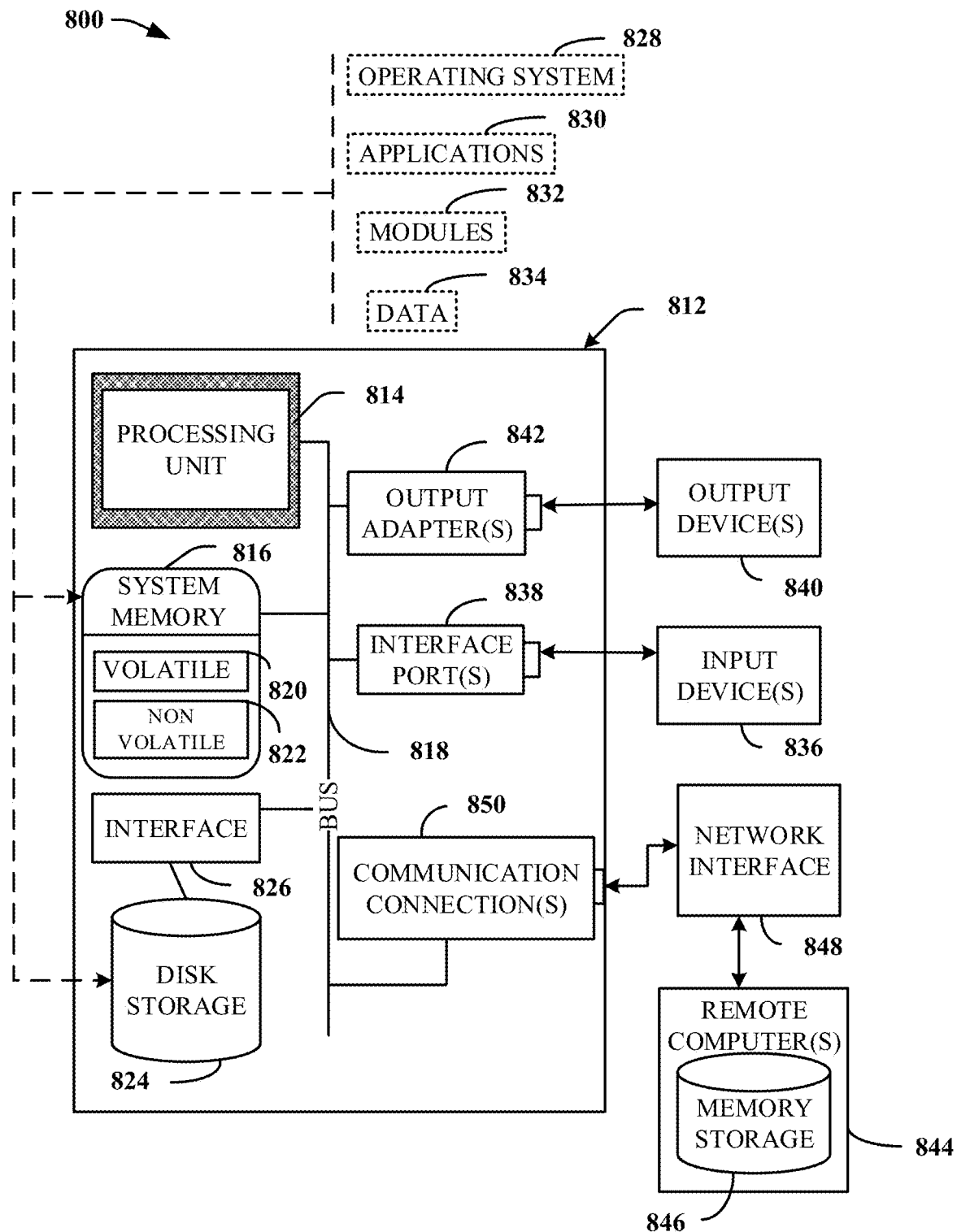
FIG. 8 illustrates a block diagram of an example, non-limiting operating environment in which one or more embodiments described herein can be facilitated.

In order to provide a context for the various aspects of the disclosed subject matter, FIG. 8 as well as the following discussion are intended to provide a general description of a suitable environment in which the various aspects of the disclosed subject matter can be implemented. FIG. 8 illustrates a suitable operating environment 800 for implementing various aspects of this disclosure can also include a computer 812. The computer 812 can also include a processing unit 814, a system memory 816, and a system bus 818. The system bus 818 can couple system components including, but not limited to, the system memory 816 to the processing unit 814. The processing unit 814 can be any of various available processors. Dual microprocessors and other multiprocessor architectures also can be employed as the processing unit 814. The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1094), and Small Computer Systems Interface (SCSI). The system memory 816 can also include volatile memory 820 and nonvolatile memory 822. The basic input/output system (BIOS), containing the basic routines to transfer information between elements within the computer 812, such as during start-up, is stored in nonvolatile memory 822. By way of illustration, and not limitation, nonvolatile memory 822 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 820 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 812 can also include removable/non-removable, volatile/nonvolatile computer storage media. FIG. 8 illustrates, for example, a disk storage 824. Disk storage 824 can also include, but is not limited to, devices like a magnetic disk drive, floppy disk drive, tape drive, Jaz drive, Zip drive, LS-100 drive, flash memory card, or memory stick. The disk storage 824 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 824 to the system bus 818, a removable or non-removable interface is typically used, such as interface 826. FIG. 8 also depicts software that acts as an intermediary between users and the basic computer resources described in the suitable operating environment 800. Such software can also include, for example, an operating system 828. Operating system 828, which can be stored on disk storage 824, acts to control and allocate resources of the computer 812. System applications 830 take advantage of the management of resources by operating system 828 through program modules 832 and program data 834, e.g., stored either in system memory 816 or on disk storage 824. It is to be appreciated that this disclosure can be implemented with various operating systems or combinations of operating systems. A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port can be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It can be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a computer, a server, a router, a network PC, a workstation, a microprocessor-based appliance, a peer device or other common network node and the like, and typically can also include many or the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 850 refers to the hardware/software employed to connect the network interface 848 to the system bus 818. While communication connection 850 is shown for illustrative clarity inside computer 812, it can also be external to computer 812. The hardware/software for connection to the network interface 848 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multitone generator device, comprising:
a controller operatively coupled to a first digital-to-analog converter (DAC) and a second digital-to-analog converter, wherein the controller applies different delays of a sampling signal to the first DAC and the second DAC to facilitate sideband suppression of signals output by the first DAC and the second DAC; and
a plurality of combinational circuits operatively coupled to the first DAC and the second DAC via a multiplexer that combines the signals output by the first DAC and the second DAC to facilitate suppressing image sidebands at respective output nodes of the multitone generator device.

2. The multitone generator device of claim 1, wherein the different delays of the sampling signal include at least one of different phases of the sampling signal or different duty cycles of the sampling signal.

3. The multitone generator device of claim 1, wherein the controller applies the different delays of the sampling signal to the first DAC and the second DAC using a phase shift of $\pi/N$ to facilitate canceling sidebands of the signals at frequencies of $(2m-1)*N$, wherein m denotes Nyquist zone order and N denotes an order of harmonic.

4. The multitone generator device of claim 1, wherein a combinational circuit of the plurality of combinational circuits is a summer circuit that combines the signals output by the first DAC and the second DAC to suppress a lower image sideband at the output node of the multitone generator device.

5. The multitone generator device of claim 1, wherein a combinational circuit of the plurality of combinational circuits is a subtractor circuit that combines the signals output by the first DAC and the second DAC to suppress an upper image sideband at the output node of the multitone generator device.

6. The multitone generator device of claim 1, further comprising:
an attenuator circuit operatively coupled to the first DAC and the second DAC that facilitates calibrating an amplitude at an output node of the multitone generator device in an analog domain.

7. The multitone generator device of claim 1, wherein the first DAC and the second DAC output the signals responsive to orthogonal baseband signals applied to respective inputs of the first and second DACs.

8. The multitone generator device of claim 1, further comprising:
a third DAC operatively coupled to the controller, wherein the controller applies a delay of the sampling signal to the third DAC to facilitate sideband suppression of signals output by the third DAC, and wherein the delay of the sampling signal that the controller applies to the third DAC is distinct from the delays of the sampling signal that the controller applies to the first DAC and the second DAC.

9. The multitone generator device of claim 1, further comprising:
a gain and filtering element (GFE) operatively coupled to an output of the first DAC, wherein the GFE facilitates mitigating a mismatch in operations of the first DAC and the second DAC.

10. The multitone generator device of claim 1, further comprising:
a channel filtering element (CFE) operatively coupled to the first DAC and the second DAC, wherein the CFE selects a subset of tones comprising a multitone signal provided at an output node of the multitone generator device from the signals output by the first DAC and the second DAC, and wherein the subset of tones comprises a cluster of tones.

11. A computer-implemented method comprising:
operatively coupling, by a system operatively coupled to a processor, a controller to a first digital-to-analog converter (DAC) and a second digital-to-analog converters (DACs) of a multitone generator device;
using, by the system, the controller to apply different delays of a sampling signal to the first DAC and the second DAC to facilitate sideband suppression of signals output by the first DAC and the second DAC; and
using, by the system, a plurality of combinational circuits operatively coupled to the first DAC and the second DAC via a multiplexer that combines the signals output by the first DAC and the second DAC to facilitate suppressing image sidebands at respective output nodes of the multitone generator device.

12. The computer-implemented method of claim 11, wherein using the controller to apply different delays of the sampling signal to the first DAC and the second DAC comprises:
using, by the system, a phase shift of $\pi/N$ to facilitate canceling sidebands of the signals at frequencies of $(2m-1)*N$, wherein m denotes Nyquist zone order and N denotes an order of harmonic.

13. The computer-implemented method of claim 11, wherein a combinational circuit of the plurality of combinational circuits is a summer circuit, and wherein using the plurality of combinational circuits comprises:
using, by the system, the summer circuit to combine the signals output by the first DAC and the second DAC to suppress a lower image sideband at the output node of the multitone generator device.

14. The computer-implemented method of claim 11, wherein a combinational circuit of the plurality of combinational circuits is a subtractor circuit, and wherein using the combinational circuit comprises:
using, by the system, the subtractor circuit to combine the signals output by the first DAC and the second DAC to suppress an upper image sideband at the output node of the multitone generator device.

15. The computer-implemented method of claim 11, wherein the different delays of the sampling signal include at least one of different phases of the sampling signal or different duty cycles of the sampling signal.

16. A computer program product comprising a computer readable storage medium having program instructions embodied therewith, the program instructions executable by a processor to cause the processor to:
operatively couple, by the processor, a controller to a first digital-to-analog converter (DAC) and a second digital-to-analog converters of a multitone generator device; and
use, by the processor, the controller to apply different delays of a sampling signal to the first DAC and the second DAC to facilitate sideband suppression of signals output by the first DAC and the second DAC; and
use, by the processor, a plurality of combinational circuits operatively coupled to the first DAC and the second DAC via a multiplexer that combines the signals output by the first DAC and the second DAC to facilitate suppressing image sidebands at respective output nodes of the multitone generator device.

17. The computer program product of claim 16, wherein using the controller to apply different phases of the sampling signal to the first DAC and the second DAC comprises:
   use, by the processor, a phase shift of $\pi/N$ to facilitate canceling sidebands of the signals at frequencies of $(2m-1)*N$, wherein m denotes Nyquist zone order and N denotes an order of harmonic.

18. The computer program product of claim 16, wherein a combinational circuit of the plurality of combinational circuits is a summer circuit, and wherein using the plurality of combinational circuits comprises:
   using, by the processor, the summer circuit to combine the signals output by the first DAC and the second DAC to suppress a lower image sideband at the output node of the multitone generator device.

19. The computer program product of claim 16, wherein a combinational circuit of the plurality of combinational circuits is a subtractor circuit, and wherein using the combinational circuit comprises:
   using, by the system, the subtractor circuit to combine the signals output by the first DAC and the second DAC to suppress an upper image sideband at the output node of the multitone generator device.

20. The computer program product of claim 16, wherein the different delays of the sampling signal include at least one of different phases of the sampling signal or different duty cycles of the sampling signal.

* * * * *